United States Patent [19]

Serizawa et al.

[11] Patent Number: 4,842,984
[45] Date of Patent: Jun. 27, 1989

[54] WATER SOLUBLE PHOTOSENSITIVE RESIN COMPOSITIONS WITH BISAZIDE COMPOUND

[75] Inventors: Hajime Serizawa; Koichi Ojima; Kiyoshi Shimizu, all of Koriyama, Japan

[73] Assignee: Nitto Boseki Co., Ltd., Fukushima, Japan

[21] Appl. No.: 67,942

[22] Filed: Jun. 29, 1987

[30] Foreign Application Priority Data

Apr. 30, 1986 [JP] Japan .................................. 61-100467

[51] Int. Cl.⁴ .......................... G03C 1/60; G03C 1/72
[52] U.S. Cl. ..................................... 430/197; 430/167; 430/194; 430/325
[58] Field of Search ............... 430/197, 194, 167, 325; 522/149

[56] References Cited

U.S. PATENT DOCUMENTS

| | | | |
|---|---|---|---|
| 2,848,328 | 8/1958 | Hepher | 430/197 |
| 4,097,283 | 6/1978 | Asano et al. | 430/197 |
| 4,540,650 | 9/1985 | Klug et al. | 430/287 |
| 4,614,701 | 9/1986 | Mori et al. | 430/197 |
| 4,687,727 | 8/1987 | Toyama et al. | 430/156 |
| 4,701,497 | 10/1987 | Serizawa et al. | 525/292 |
| 4,778,725 | 10/1988 | Serizawa et al. | 428/418 |

FOREIGN PATENT DOCUMENTS 0207495  1/1987  European Pat. Off. .

Primary Examiner—Charles L. Bowers, Jr.
Attorney, Agent, or Firm—Bert J. Lewen; Henry Sternberg

[57] ABSTRACT

A novel photosensitive resin composition, which has fairly high sensitivity to light and developable with water comprising of essential components a resin represented by the general formula (I),

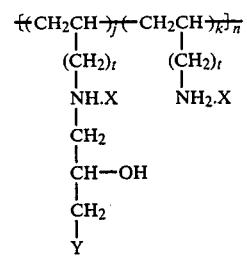

wherein X, which may be present or absent, represents acetic acid when present, Y stands for a group containing carbon-carbon double bond(s) represented by the formula (II),

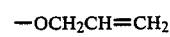

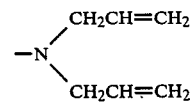

n is an integer of 10 or greater, more than 0 and less than 1, and t is 0 or 1, and a sodium or potassium salt of 4,4'-diazidostilbene-2,2'-disulfonic acid represented by the general formula (IV),

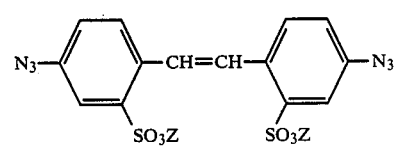

wherein z stands for sodium atom or potassium atom; or the resin represented by the general formula (I), the sodium or potassium salt of 4,4'-diazidostilbene-2,2'-disulfonic acid represented by the general formula (IV), and an aromatic ketone represented by the general formula (V),

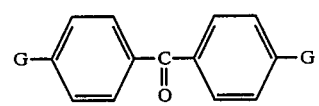

wherein G stands for hydrogen atom or an amino group or dialkylamino group represented by the general formula (VI),

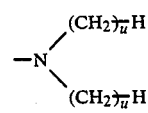

where u is 0, 1 or 2.

9 Claims, No Drawings

WATER SOLUBLE PHOTOSENSITIVE RESIN COMPOSITIONS WITH BISAZIDE COMPOUND

This invention relates to novel photosensitive resin compositions, more particularly to photosensitive resin compositions having fairly high sensitivity to light and developable with water.

Some polymeric substances have been known as negative type photosensitive resins, among which, for instance, polyvinyl cinnamate obtainable by the polymerization of vinyl cinnamate disclosed in the specification of U.S. Pat. No. 2,610,210 granted to Eastman Kodak Corp. in 1952 is well known.

This photosensitive resin produced according to U.S. Patent method mentioned above, however, had the problems that the isolation and purification thereof were complicated due to the occurrence of side reaction such as partial polymerization in the synthesis of the monomer, and that the resin, after exposure to light, would become hard and frail because of the presence of too many active sites. Further, this photosensitive resin was disadvantageous in its industrial applications because of, for instance, the necessity of using an organic solvent for the development.

For the purpose of improving these points, a photosensitive resin has been synthesized by using a polyvinyl alcohol resin as base material and reacting therewith a chloride of cinnamic acid.

This resin, however, it still unsatisfactory in certain matters, for example, use of an organic solvent in the development thereof.

An organic solvent is used as developer for the photoresists represented by polyvinyl cinnamate, whereas use of an aqueous developer is desired for the safety of working environments.

To satisfy such need, work has been done on a method for modifying the resins so that they may be soluble in alkaline solutions, preferably in water. Among the hitherto proposed modification methods are introduction of carboxyl group (U.S. Pat. No. 2,861,058 granted to Eastman Kodak, 1958), introduction of a phenolic hydroxyl group (Japanese Patent Publication No. 44601/74 filed by Fuji Yakuhin Kogyo K.K.) and introduction of a sulfonic group (Japanese Patent Application Kokai (Laid-Open) No. 55282/73 filed by Unichika Ltd.). These methods, however, have the drawback that they add an extra step for modification to the resin production process and make the producing operations complicated and time-consuming, leading to an increase in manufacturing cost.

The above-mentioned photosensitive resins contain unsaturated functional groups in their respective molecules which undergo an intermolecular reaction upon irradiation with light to induce cross-linkage and insolubilization of the molecules.

Of other hand, there are many reports on the photosensitive resin system composed of two different types of material which readily react with each other upon light irradiation. For instance, in U.S. Pat. No. 2,852,379, it had been reported that natural rubber, synthetic cyclized rubber containing 4,4'-diazidobenzophenone, 4-4'-diazidodiphenylmethane or 4,4'-diazidostilbene was crosslinked upon exposure of light.

Furthermore, German Pat. No. 514,057 disclosed that a mixture consisting of a water-soluble polymer and a water-soluble bisazido compound such as sodium 4,4'-diazidostilbene-2,2'-disulfonate or sodium 1,5-diazidonaphthalene-3,7-disulfonate can be cured by light irradiation.

However, the former photosensitive resin is not able to be developed with water, and the latter has poor film-forming properties or poor adhesiveness to glass, wood and metals even through it is developable with water.

The object of this invention, therefore, is to provide a novel photosensitive resin composition which does not have the above defects.

As a result of many studies, it has been discovered that a photosensitive resin composition comprising a resin represented by the following general formula (I) and a sodium or potassium salt of 4,4'-diazidostilbene-2,2'-disulfonic acid, and the composition obtained by further adding an aromatic ketone represented by the following general formula (V) did not have above defects, that is, these composition have fairly high photosensitivity and can be developed with water.

General formula (I)

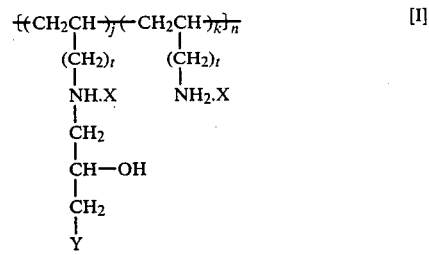

wherein X, which may be present or absent, represents an organic acid when it is present, Y stands for a group containing carbon-carbon double bond(s) represented by the formula (II) or (III):

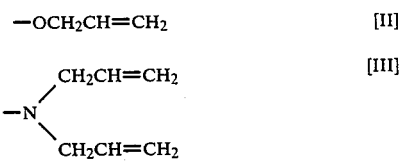

n is an integer of 10 or greater, j/j+k is greater than 0 and less than 1, and t is 0 or 1.

General formula (IV)

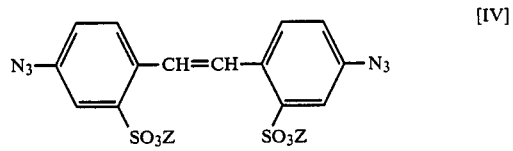

wherein Z stands for sodium atom or potassium atom.

General formula (V)

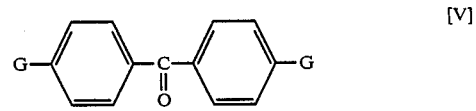

where G stands for hydrogen atom or an amino group or dialkylamino group represented by the general formula (VI):

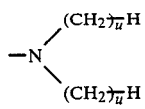 [VI]

where u is 0, 1 or 2.

The resin of general formula (I), diazidostilbenedisulfonate of general formula (IV) and aromatic ketone of general formula (V) will hereinafter be referred to as component 1, component 2 and component 3, respectively, as occasion arises.

The respective components in the compositions according to this invention will be described in detail below.

The resin of general formula (I), or component 1, is prepared by reacting polyallylamine or polyvinylamine with an epoxy group-containing allyl compound represented by the general formula (VII):

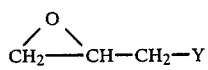 [VII]

wherein Y stands for a carbon-carbon double bond-containing group represented by the formula (II) or (III):

 [II]

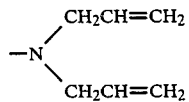 [III]

The preparation process is described in detail in the specification of Japanese Patent Application No. 99145/86 (which corresponds to U.S. patent application Ser. No. 43,179, filed Apr. 27, 1977).

In the present invention, the film-forming properties of the photosensitive resin, flexibility of the coating film thereof after exposure to light and adhesiveness to glass, wood and metals is greatly dependent on the resin of general formula (I), or component 1.

However, when this component 1 alone is coated on glass plate and irradiated with light, a long irradiation time is required until the coated resin is sufficiently cross-linked. Furthermore, the cured coating film is not adequately resistant to water and organic solvents. For the improvement, it is necessary to further enhance the photosensitivity of the resin of formula (I), or component 1.

For enhancing the photosensitivity of the resin, it is generally practiced to increase the content of photosensitive group in the resin, or to add other substance which contains more than two photosensitive portion in the molecule and reacts with above resin upon exposure to light.

However, when one attempts to enhance the photosensitivity alone, it often turns out that the cured resin film-forming properties deteriorate and also the coating film thereof become hard and frail as well as poorly adhesive to various kind of material (glass, wood, metal, etc.).

As a result of further studies for resolving the problem of above antithetical characters of photosensitive resin, a photosensitive resin composition was prepared by adding the material of formula (IV), or component 2, to the resin of formula (I), or component 1, or by adding the material to formula (IV), component 2, and the material of formula (V), or component 3, to the resin of formula (I), or component 1. It was found that such composition was markedly improved in the properties such as photosensitivity and chemical resistance without compromising the film-forming properties, flexibility and adhesiveness of the resin. The present invention is based on such finding. In above composition, the properties of the photosensitive resin are dependent on the content of component 2 since too small the content contributes to low photosensitivity while too high the content causes adverse effect to the properties such as flexibility and adhesiveness of the cured coating film. The preferred content of component 2, therefore, is 0.1 to 30% by weight, more preferably 2 to 15 wt % based on the resin used as component 1.

The photosensitive resin composition consisting of component 1 and component 2 alone can well serve for the ordinary purposes of use of photosensitive resin.

In case it is desirable to use a short irradiation time for increasing the productivity, for instance, in the electronics industry, it is desired to further enhance this photosensitivity. The object can be attained by further adding to this composition an aromatic ketone of formula (V) in a small amount as component 3.

It is commonly practiced for enhancing the photosensitivity of photosensitivity resins to add photosensitizer such as ketones and aromatic quinones. Such photosensitizer, however, can not be used without qualification since the performance of photosensitizer differs greatly according to the type of photosensitive resin. It has been found that the most effective sensitizers, the ketones, are effective photosensitizers for the photosensitive resin composition consisting of components 1 and 2 in this invention, and the aromatic ketones represented by the formula (V) are excellent.

In this invention, the content of the aromatic ketone of formula (V) used as component 3 in the composition differs according to the purpose of use, namely the required photosensitivity of the product, but usually it suffices to add this component 3 in an amount of 0.1 to 10 wt %, preferably 1 to 7 wt %, based on the content of the material of the formula (IV), or component 2.

The photo-crosslinked resin obtained by using above photosensitive resin composition of this invention has high flexibility and excellent film-forming properties and also exhibits good adhesiveness to various kind of material. Further, the photo-crosslinked resin coat has excellent water and chemical resistance and especially shows an fairly high acid resistance. Therefore, the resin of this invention finds particularly useful application in the field of electronic materials. Furthermore, the photocrosslinked resin coat obtained from the composition in this invention is not only excellent in transparency but also has good affinity for certain types of dye and can be colored by merely dipping into a dye solution at room temperature. This enables the use of the resins of this invention as color filters in liquid crystal displays, etc.

The present invention will be further described by the examples set forth below. It is to be understood that these examples are given for the purpose of illustration only, and are not to be construed as limiting the scope of this invention.

EXAMPLE 1

A resin represented by the following chemical structure (I-I) was used as component 1:

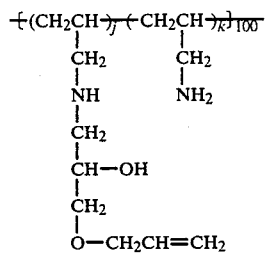

=Y, where $j/j+k$ is 0.65 and $k/j+k$ is 0.35.

This resin (I-1) was dissolved in methyl cellosolve and further mixed with sodium 4,4'-diazidostilbene-2,2'-disulfonate as component 2 and Michler's ketone as component 3 in the ratios shown below to prepare a photosensitive resin solution:

| | |
|---|---|
| Resin (I-1) | 10.00 g |
| Methyl cellosolve | 90.00 g |
| Sodium 4,4'-diazidostilbene-2,2'-disulfonate | 1.00 g |
| Michler's ketone | 0.04 g |

This solution was spin coated on a glass plate by using a spinner mfd. by Mikasa Ltd. at a speed of 1,500 r.p.m., and then dried at 70° C. for 20 minutes.

The resultant coating had a thickness of about 1 μm.

The coating was exposed to light through a photomask at an irradiation intensity of 10.5 W/cm² for 5 seconds by using a 250 W ultra-high pressure mercury lamp made by Ushio Denki Co., Ltd. as light source.

Then the coating was immersed in water at 20° C. for 4 minutes to remove the unexposed resin and hydroextracted by spinning at a speed of 3,000 r.p.m. for one minute. The plate containing the image was heat treated in the air at 100° C. for one hour, then immersed in a 5% methanol solution of an acid dye (Alizarin Brilliant Sky Blue RLW) at room temperature for 30 minutes, washed with methanol and dried at room temperature. There was obtained a clear image of the exposed portion colored in deep blue.

EXAMPLE 2

Solutions were prepared according to the same procedure as Example 1 except that resins (I-2), (I-3) and (I-4) represented by the following chemical structure were used as component 1 in the place of the resin (I-1). Each of these solution was coated on a glass plate, dried, exposed, heat-treated and dyed in a similar manner as Example 1.

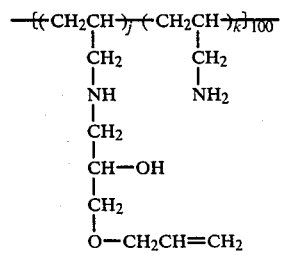

Resin (I-2), $j/j+k = 0.46$
Resin (I-3), $j/j+k = 0.37$
Resin (I-4), $j/j+k = 0.26$ As a result, there was obtained a clear image of the exposed portion colored in deep blue with each of the systems using above resin (I-2), (I-3) and (I-4), respectively.

EXAMPLE 3

Resin (I-1) (component 1) used in Example 1 was dissolved in methyl cellosolve in a concentration of 10 wt. %. this solution was added sodium 4,4'-diazidostilbene-2,2'-disulfonate (additive A) as component 2 in various amounts, followed by addition of Michler's ketone in an amount of 4% by weight based on sodium 4,4'-diazidostilbene-2,2'-disulfonate.

Each of the photosensitive resin solutions was coated on a glass plate, dried, exposed, heat-treated and dyed in a similar manner as Example 1 except that the exposure time was varied. The minimum exposure time required for obtaining a clear image of exposed portion colored in deep blue was determined. The results are shown in Table 1.

TABLE 1

| Wt % of additive A, based on resin (I-1) | Minimum exposure time for obtaining clear image of exposed portion |
|---|---|
| 30% | <1 sec. |
| 20% | <1 sec. |
| 10% | <1 sec. |
| 5% | 1 sec. |
| 2% | 5 sec. |
| 1% | 8 sec. |

EXAMPLE 4

Resin (I-1) (component 1) used in Example 1 was dissolved in methyl cellosolve in a concentration of wt. %. To this solution was added sodium 4,4'-diazidostilbene-2,2'-disulfonate (additive A) as component 2 in an amount of 10% by weight based on the resin (I-1) and Michler's ketone as component 3 in various amounts.

Each of these solutions was coated on a glass plate and the coating was dried, exposed, heat-treated and dyed in a similar manner as Example 1 except that the exposure time was varied. The minimum exposure time required for obtaining a clear image was determined. The results are shown in Table 2.

TABLE 2

| Wt % of Michler's ketone, based on additive A | Minimum exposure time for obtaining clear image of exposed portion |
|---|---|
| 0.0% | 5 sec. |
| 0.5% | 4 sec. |
| 1.0% | 2 sec. |
| 2.0% | 1 sec. |
| 4.0% | <1 sec. |
| 6.0% | 1 sec. |
| 7.0% | 2 sec. |
| 10.0% | 4 sec. |

EXAMPLE 5

In a similar manner as Example 4 except that benzophenone was used in the place of Michler's ketone as component 3, the minimum exposure time required for obtaining a clear image was determined. The results are shown in Table 3.

TABLE 3

| Wt % of benzophenone based on additive A | Minimum exposure time for obtaining clear image of exposed portion |
| --- | --- |
| 0.0% | 12 sec. |
| 0.5% | 9 sec. |
| 1.0% | 6 sec. |
| 2.0% | 4 sec. |
| 4.0% | 2 sec. |
| 6.0% | 2 sec. |
| 7.0% | 3 sec. |
| 10.0% | 10 sec. |

EXAMPLE 6

A resin represented by the following chemical structure (I-5) was used as component 1.

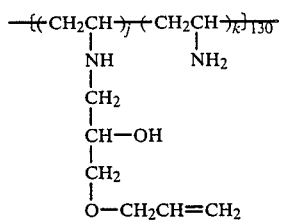

wherein $j/j+k=0.63$ and $K/j+k=0.37$.

The resin (I-5) was dissolved in methyl cellosolve in a concentration of 10 wt % solution. To this solution were added sodium 4,4'-diazidostilbene2,2'-disulfonate (additive A) as component 2 and Michler's ketone as component 3 in the ratios shown below to prepare a solution of photosensitive resin composition.

| | |
| --- | --- |
| Resin (I-5) | 10.00 g |
| Methyl cellosolve | 90.00 g |
| Sodium 4,4'-diazidostilbene-2,2'-disulfonate | 1.00 g |
| Michler's ketone | 0.04 g |

The thus prepared solution was coated on a glass plate, dried, exposed, heat treated and dyed according to the same procedure as Example 1. There was obtained a clear image of the exposed portion colored in deep blue.

EXAMPLE 7

The resin (I-5) used in Example 6 as component 1 was dissolved in methyl cellosolve to form a 10 wt % solution. To this solution was added sodium 4,4'-diazidostilbene-2,2'-disulfonate (additive A) as component 2 in various amounts, followed by further addition of Michler's ketone in an amount of 4% by weight based on additive A.

Solutions were also prepared by adding additive A to the 10 wt % methyl cellosolve solution of resin (I-5) in an amount of 10 wt % based on resin (I-5), followed by further addition of Michler's ketone in various amounts.

Each of these solutions was subjected to coating on a glass plate, drying, exposure and dyeing according to the same procedure as Example 1 except that the exposure time was varied. The exposure time required for obtaining a clear image of the exposed portion colored in deep blue was determined. The results are shown in Tables 4 and 5.

TABLE 4

| | Minimum exposure time in the system where the content of additive A was changed |
| --- | --- |
| Wt % of additive A based on resin (I-5) | Minimum exposure time for obtaining clear image of exposed portion |
| 30% | <1 sec. |
| 20% | <1 sec. |
| 10% | <1 sec. |
| 5% | 1 sec. |
| 2% | 5 sec. |
| 1% | 8 sec. |

TABLE 5

| | Minimum exposure time in the system where the content of Michler's ketone was changed |
| --- | --- |
| Wt % of Michler's ketone based on additive A | Minimum exposure time for obtaining clear image of exposed portion |
| 0.0% | 5 sec. |
| 0.5% | 4 sec. |
| 1.0% | 2 sec. |
| 2.0% | 1 sec. |
| 4.0% | <1 sec. |
| 6.0% | 1 sec. |
| 7.0% | 3 sec. |
| 10.0% | 4 sec. |

EXAMPLE 8

The resin (I-5) used in Example 6 was dissolved as component 1 in methyl cellosolve in a concentration of 10 wt. %. To this solution was added sodium 4,4'-diazidostilbene-2,2'-disulfonate (additive A) as component 2 in an amount of 10 wt % based on the resin (I-5), followed by addition of benzophenone as component 3 in various amounts.

Each of these solutions was coated on a glass plate, dried, exposed, developed and dyed according to the same procedure as Example 1 except that the exposure time was varied. The exposure time required for obtaining a clear image was determined, the results being shown in Table 6.

TABLE 6

| Wt % of benzophenone based on additive A | Minimum exposure time for obtaining clear image of exposed portion |
| --- | --- |
| 0.0% | 5 sec. |
| 0.5% | 4 sec. |
| 1.0% | 3 sec. |
| 2.0% | 1 sec. |
| 4.0% | 1 sec. |
| 6.0% | 1 sec. |
| 7.0% | 3 sec. |
| 10.0% | 4 sec. |

EXAMPLE 9

The resins (I-1, I-5) used in Examples 1, 6 were respectively dissolved as component 1 in methyl cellosolve in a concentration of 10 wt. %. To each of these solutions was added sodium 4,4'-diazidostilbene-2,2'-disulfonate (additive A) in various amounts. Each of these solutions was coated on a glass plate, dried, exposed, heat-treated and dyed according to the same procedure as Example 1 except that the exposure time was varied. The minimum exposure time required for obtaining a clear image was determined. The results are shown in Tables 7 and 8.

TABLE 7

Minimum exposure time in the system where resin (I-1) was used

| Wt % of additive A base on resin (I-1) | Minimum exposure time for obtaining clear image of exposed portion |
|---|---|
| 1.0% | 10 sec. |
| 2.0% | 5 sec. |
| 5.0% | 3 sec. |
| 10.0% | 3 sec. |
| 20.0% | 3 sec. |
| 30.0% | 3 sec. |

TABLE 8

Minimum exposure time in the system where resin (I-5) was used

| Wt % of additive A based on resin (I-5) | Minimum exposure time for obtaining clear image of exposed portion |
|---|---|
| 1.0% | 11 sec. |
| 2.0% | 6 sec. |
| 5.0% | 3 sec. |
| 10.0% | 3 sec. |
| 20.0% | 3 sec. |
| 30.0% | 3 sec. |

EXAMPLE 10

A resin having the following chemical structure (I-6) was used as component 1:

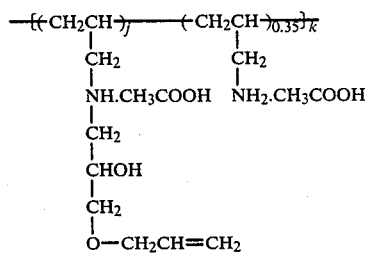

This resin (I-6) was dissolved in methyl cellosolve and then mixed with sodium 4,4'-diazidostilbene-2,2'-disulfonate (additive A) as component 1 to prepare a photosensitive resin solution (a) having the following composition:

| Composition of solution (a) | |
|---|---|
| Resin (I-6) | 10.00 g |
| Methyl cellosolve | 90.00 g |
| Sodium 4,4'-diazido-stilbene-2,2'-disulfonate | 1.00 g |

Michler's ketone was also added as component 3 to the solution shall (a) mentioned above. This solution be referred as a solution (b). The composition of the solution (b) was as follows:

| Composition of solution (b) | |
|---|---|
| Resin (I-6) | 10.00 g |
| Methyl cellosolve | 90.00 g |
| Sodium 4,4'-diazidostilbene-2,2'-disulfonate | 1.00 g |

| Composition of solution (b) | |
|---|---|
| Michler's ketone | 0.04 g |

Each of the above solutions (a) and (b) was coated on a glass plate, dried, exposed, heat-treated and dyed according to the procedure in Example 1.

A blue-colored clear image of the exposed portion was obtained with both solution (a) and (b).

EXAMPLE 11

The glass plates forming a clear image of exposed portion obtained in Examples 1–10 were immersed in a potassium bichromate-sulfuric acid mixed solution, water and methanol, and the resultant state of the coating film was observed with the naked eye.

All of the samples used here showed the same results. The results are shown in Table 9.

TABLE 9

| Chemical used for immersion | Immersion conditions Temp. | Immersion conditions Time | State of peel |
|---|---|---|---|
| Potassium bichromate-sulfuric acid mixed solution | 20° C. | 3 days | O |
| Potassium bichromate-sulfuric acid mixed solution | 60° C. | 3 hr. | X |
| Water | 60° C. | 1.6 hr. | O |
| Methanol | 30° C. | 2 days | O |

O: No peel
X: Peeled or swollen

What is claimed is:

1. A photosensitive resin composition comprising in admixture a resin represented by the formula:

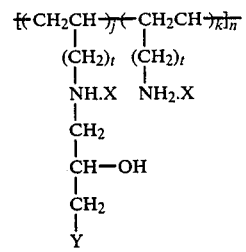

wherein X, which may be present or absent, represents acetic acid when present, Y stands for a group represented by the formula —OCH$_2$CH=CH$_2$, n is an integer of 10 or greater, j/j+k is more than 0 and less than 1, and t is 0 or 1; and a photosensitivity-enhancing amount of salt represented by the formula:

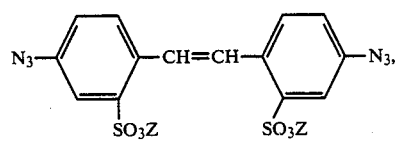

where Z stands for sodium or potassium.

2. A photosensitive resin composition according to claim 1 wherein the salt comprises from 0.1 to 30 wt. % of the total composition.

3. A photosensitive resin composition comprising in admixture a resin represented by the formula:

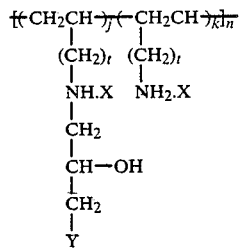

wherein X, which may be present or absent, represents acetic acid when present, Y stands for a group represented by the formula —OCH$_2$CH=CH$_2$, n is an integer of 10 or greater, j/j+k is more than 0 and less than 1, and t is 0 or 1; and a photosensitivity-enhancing amount of a salt represented by the formula:

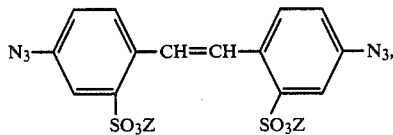

where Z stands for sodium or potassium; and a photosensitivity-enhancing amount of an aromatic ketone represented by the formula:

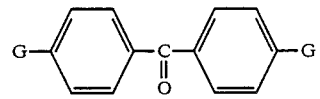

wherein G stands for hydrogen, an amino group of a dialkylamino group represented by the formula:

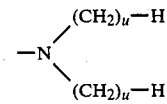

where u is 0, 1 or 2.

4. A photosensitive resin composition according to claim 3 wherein the salt comprises from 0.1 to 30 wt. % of the total composition.

5. A photosensitive resin composition according to claim 3 wherein the salt comprises from 0.1 to 30 wt. % of the total composition and the aromatic ketone comprises from 0.1 to 10 wt. % of the total composition.

6. A photosensitive resin composition according to claim 3 wherein j/j+k is from 0.26 to 0.65, t is 1, n is an integer of 100 to 130, Z is sodium, and the aromatic ketone is Michler's ketone or benzophenone.

7. A photosensitive resin composition according to claim 3 wherein X is absent, j/j+k is from 0.26 to 0.65, t is 1, n is an integer of 100 to 130, Z is sodium, and the aromatic ketone is Michler's ketone.

8. A photosensitive resin composition according to claim 3 wherein X is absent, j/j+k is from 0.26 to 0.65, t is 1, n is an integer of 100 to 130, Z is sodium, and the aromatic ketone is benzophenone.

9. A photosensitive resin composition according to claim 3 wherein X is acetic acid, j/j+k is from 0.26 to 0.65, t is 1, n is an integer of 100 to 130, Z is sodium, and the aromatic ketone is Michler's ketone.

* * * * *